United States Patent
Ha et al.

(10) Patent No.: US 9,099,336 B2
(45) Date of Patent: Aug. 4, 2015

(54) SEMICONDUCTOR DEVICE AND FABRICATING METHOD THEREOF

(71) Applicant: Samsung Electronics Co., Ltd., Suwon-si (KR)

(72) Inventors: Tae-Won Ha, Seongnam-si (KR); Suk-Hoon Kim, Yongin-si (KR); Ju-Youn Kim, Suwon-si (KR); Kwang-You Seo, Suwon-si (KR); Jong-Mil Youn, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 5 days.

(21) Appl. No.: 13/834,488

(22) Filed: Mar. 15, 2013

(65) Prior Publication Data

US 2014/0239405 A1 Aug. 28, 2014

(30) Foreign Application Priority Data

Feb. 25, 2013 (KR) ........................ 10-2013-0020004

(51) Int. Cl.
| | |
|---|---|
| H01L 27/092 | (2006.01) |
| H01L 29/78 | (2006.01) |
| H01L 21/8238 | (2006.01) |
| H01L 29/49 | (2006.01) |
| H01L 29/51 | (2006.01) |
| H01L 29/10 | (2006.01) |

(52) U.S. Cl.
CPC ...... *H01L 27/092* (2013.01); *H01L 21/823807* (2013.01); *H01L 21/823842* (2013.01); *H01L 29/1054* (2013.01); *H01L 29/4958* (2013.01); *H01L 29/517* (2013.01); *H01L 29/78* (2013.01); *H01L 29/7833* (2013.01)

(58) Field of Classification Search
CPC ................. H01L 21/82307; H01L 21/823814; H01L 29/7843; H01L 29/7848; H01L 27/088; H01L 21/336
USPC ........... 257/369, 314, 411; 438/257, 593, 785
See application file for complete search history.

(56) References Cited

U.S. PATENT DOCUMENTS

| | | | |
|---|---|---|---|
| 7,378,713 B2 | 5/2008 | Hsu et al. | |
| 7,838,908 B2 | 11/2010 | Kwon et al. | |
| 7,936,025 B2 | 5/2011 | Chau et al. | |
| 7,989,902 B2 | 8/2011 | Ando et al. | |
| 2005/0151184 A1* | 7/2005 | Lee et al. | 257/314 |
| 2008/0203488 A1* | 8/2008 | Chung et al. | 257/369 |
| 2010/0187610 A1* | 7/2010 | Kwon et al. | 257/369 |
| 2010/0258878 A1 | 10/2010 | Mise et al. | |
| 2011/0207280 A1 | 8/2011 | Ando et al. | |
| 2011/0241086 A1 | 10/2011 | Kurz et al. | |
| 2011/0272765 A1 | 11/2011 | Seo et al. | |
| 2011/0298060 A1 | 12/2011 | Chen et al. | |

(Continued)

FOREIGN PATENT DOCUMENTS

JP 2011014690 1/2011

*Primary Examiner* — Fernando L Toledo
*Assistant Examiner* — Lawrence-Linh T Nguyen
(74) *Attorney, Agent, or Firm* — Onello & Mello, LLP

(57) ABSTRACT

A semiconductor device using a high-k dielectric film is provided. The semiconductor device comprises a first gate insulating layer on a substrate and a first barrier layer on the first gate insulating layer, the first barrier layer having a first thickness. A first work function control layer is on the first barrier layer. A second barrier layer is present on the first work function control layer, the second barrier layer having a second thickness that is less than the first thickness.

15 Claims, 6 Drawing Sheets

(56) References Cited

U.S. PATENT DOCUMENTS

| | | |
|---|---|---|
| 2011/0298062 A1 | 12/2011 | Ganguli et al. |
| 2011/0309434 A1 | 12/2011 | Huang et al. |
| 2011/0309455 A1 | 12/2011 | Ando et al. |
| 2012/0021596 A1 | 1/2012 | Han et al. |
| 2012/0038009 A1 | 2/2012 | Toh et al. |
| 2012/0049291 A1 | 3/2012 | Scheiper et al. |
| 2012/0056269 A1 | 3/2012 | Chung et al. |
| 2012/0061772 A1 | 3/2012 | Guo et al. |
| 2012/0119204 A1 | 5/2012 | Wong et al. |
| 2012/0119302 A1 | 5/2012 | Pei et al. |
| 2012/0129327 A1 | 5/2012 | Lee |
| 2012/0139015 A1 | 6/2012 | Yu et al. |
| 2012/0139062 A1 | 6/2012 | Yuan et al. |
| 2012/0181616 A1 | 7/2012 | Chudzik et al. |
| 2012/0184093 A1 | 7/2012 | Chudzik et al. |
| 2012/0187420 A1 | 7/2012 | Li et al. |
| 2012/0193727 A1 | 8/2012 | Carter et al. |
| 2012/0211844 A1 | 8/2012 | Schloesser et al. |
| 2012/0223394 A1 | 9/2012 | Toh et al. |

\* cited by examiner

SEMICONDUCTOR DEVICE AND FABRICATING METHOD THEREOF

CROSS-REFERENCE TO RELATED APPLICATION

This application claims priority from Korean Patent Application No. 10-2013-0020004 filed on Feb. 25, 2013 in the Korean Intellectual Property Office, and all the benefits accruing therefrom under 35 U.S.C. 119, the contents of which in its entirety are herein incorporated by reference.

BACKGROUND

1. Field

The present inventive concepts relate to semiconductor devices, and more particularly, to semiconductor devices that employ a high-k dielectric film.

2. Description of the Related Art

As the feature size of a MOS transistor is reduced, the gate length and channel length are likewise reduced. Accordingly, it is necessary to reduce a thickness of a gate insulating layer to increase capacitance between the gate and the channel and to improve operating characteristics of the resulting MOS transistor.

However, as the thickness of a silicon oxide layer, or silicon oxynitride layer, which are materials that are primarily used as a gate insulating layer, is reduced, certain physical limitations can manifest themselves which adversely affect the electric properties of the resulting device. That is to say, in a case wherein the silicon oxide layer is formed too thin, direct tunneling current can be increased, resulting in increased leakage current between the gate and the channel and, therefore, increased power consumption.

Therefore, in order to replace the conventional silicon oxide film, research into a high-k dielectric film having a high dielectric constant is being actively conducted. Such a high-k dielectric film can reduce leakage current between the gate and the channel while permitting a relatively thin geometry.

SUMMARY

The present inventive concepts provide a semiconductor device having improved operating characteristics.

The present inventive concepts also provide a fabricating method of the semiconductor device having improved operating characteristics.

These and other objects of the present inventive concepts will be described in or be apparent from the following description of embodiments.

In one aspect, a semiconductor device comprises: a first gate insulating layer on a substrate; a first barrier layer on the first gate insulating layer, the first barrier layer having a first thickness; a first work function control layer on the first barrier layer; and a second barrier layer on the first work function control layer, the second barrier layer having a second thickness, the second thickness being less than the first thickness.

In some embodiments, the semiconductor device further comprises a second work function control layer on the second barrier layer, the second work function control layer comprising a material that is different than a material of the first work function control layer.

In some embodiments, the first work function control layer includes at least one of Al, Ti and Ta, and the second work function control layer includes La.

In some embodiments, a metallic material included in the first work function control layer is not present in the first gate insulating layer.

In some embodiments, the first barrier layer has a first thickness in a range between about 20 Å and about 40 Å.

In some embodiments, the second barrier layer has a second thickness in a range of greater than 0 Å and less than about 20 Å.

In some embodiments, the second barrier layer has a second thickness of 0 Å, and a second work function control layer is further present on the first work function control layer so as to make contact with the first work function control layer.

In some embodiments, the semiconductor device further comprises a stress layer between the substrate and the first gate insulating layer.

In another aspect, a semiconductor device comprises: a substrate having first region and a second region defined therein; a PMOS transistor including a first gate insulating layer, a first barrier layer having a first thickness, a P-type work function control layer and a second barrier layer having a second thickness less than the first thickness, which are sequentially formed on the first region; and an NMOS transistor including a second gate insulating layer and an N-type work function control layer, which are sequentially formed on the second region.

In some embodiments, the PMOS transistor further includes an N-type work function control layer on the second barrier layer.

In some embodiments, the P-type work function control layer includes at least one of Al, Ti and Ta, and the N-type work function control layer includes La.

In some embodiments, a metallic material contained in the P-type work function control layer is not present in the first gate insulating layer.

In some embodiments, the first barrier layer has a first thickness in a range between about 20 Å and about 40 Å, and the second barrier layer has a second thickness in a range of greater than 0 Å and less than about 20 Å.

In some embodiments, the second barrier layer has a second thickness of 0 Å, and an N-type work function control layer is further present on the P-type work function control layer so as to make contact with the P-type work function control layer.

In some embodiments, the semiconductor device further comprises a stress layer between the first region of the substrate and the first gate insulating layer.

In another aspect, a semiconductor device comprises: a PMOS transistor in a first region of a substrate, the PMOS transistor comprising a PMOS gate structure and source/drain regions in the substrate at sides of the PMOS gate structure, the PMOS gate structure comprising a first gate insulating layer, a first barrier layer on the first gate insulating layer, a first work function control layer on the first barrier layer and a second work function control layer on the first work function control layer; and an NMOS transistor in a second region of a substrate, the NMOS transistor comprising an NMOS gate structure and source/drain regions in the substrate at sides of the NMOS gate structure.

In some embodiments, the first gate insulating layer comprises a high-k material.

In some embodiments, the second work function control layer of the PMOS gate structure is in direct contact with the first work function control layer of the PMOS gate structure.

In some embodiments, the PMOS gate structure further comprises a second barrier layer on the first work function control layer of the PMOS gate structure, wherein the second work function control layer of the PMOS gate structure is on the second barrier layer of the PMOS gate structure, and wherein the second barrier layer is of a thickness that is less than a thickness of the first barrier layer.

In some embodiments, the NMOS gate structure comprises a first gate insulating layer, a first barrier layer on the first gate insulating layer and a first work function control layer on the first gate insulating layer.

BRIEF DESCRIPTION OF THE DRAWINGS

The above and other features and advantages of the present inventive concepts will become more apparent by describing in detail embodiments thereof with reference to the attached drawings in which.

DETAILED DESCRIPTION OF EMBODIMENTS

Figure 1:
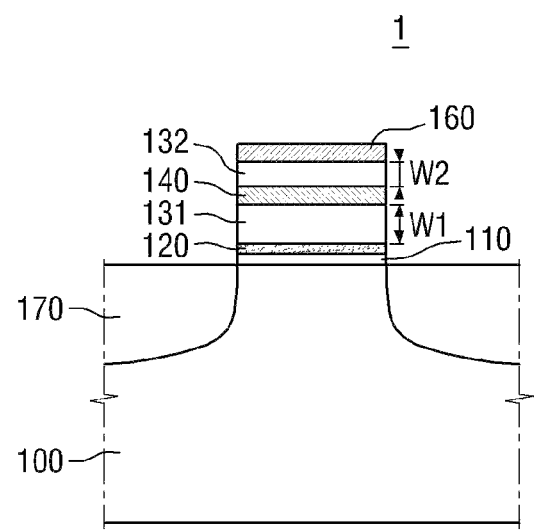
FIG. 1 is cross-sectional view of a semiconductor device according to a first embodiment of the present inventive concepts.

Advantages and features of the present inventive concepts and methods of accomplishing the same may be understood more readily by reference to the following detailed description of embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the concept of the inventive concepts to those skilled in the art, and the present inventive concepts will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The present inventive concepts will be described with reference to perspective views, cross-sectional views, and/or plan views, in which embodiments of the inventive concepts are shown. Thus, the profile of an exemplary view may be modified according to manufacturing techniques and/or allowances. That is, the embodiments of the inventive concepts are not intended to limit the scope of the present inventive concepts but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this inventive concepts belongs. It is noted that the use of any and all examples, or exemplary terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Hereinafter, a semiconductor device according to a first embodiment of the present inventive concepts will be described with reference to FIG. 1.

FIG. 1 is cross-sectional view of a semiconductor device according to a first embodiment of the present inventive concepts. A PMOS transistor is illustrated as the semiconductor device in FIG. 1 by way of example, but aspects of the present inventive concepts are not limited thereto. For example, the transistor in accordance with the inventive concepts can be employed as an NMOS transistor, or other forms of switches or transistors. In addition, the semiconductor device shown in FIG. 1 may have a gate-first structure.

Referring to FIG. 1, the semiconductor device 1 according to the first embodiment of the present inventive concepts may include a substrate 100, a first interface layer 110, a first gate insulating layer 120, a first barrier layer 131, a first work function control layer 140, a second barrier layer 132, and a second work function control layer 160.

The substrate 100 may comprise any of a number of suitable substrate materials, including, for example, a silicon substrate, a gallium arsenic substrate, a silicon germanium substrate, a ceramic substrate, a quartz substrate, a glass substrate for display, or a silicon on insulator (SOI) substrate.

The first interface layer 110 may prevent an interfacial failure between the substrate 100 and the first gate insulating layer 120. in various embodiments, the first interface layer 110 may include, for example, a low-k dielectric layer having a dielectric constant (k) of 9 or less, a silicon oxide film having a dielectric constant (k) of approximately 4, or a silicon oxynitride film having a dielectric constant (k) in a range of 4 to 8 according to the concentration of oxygen or nitrogen atoms. In addition, in other embodiments, the first interface film 110 may include silicate, or a combination of the layers listed above.

The first gate insulating layer 120 may be formed on the first interface layer 110. In various embodiments, the first gate insulating layer 120 may include a high-k dielectric material selected from the group consisting of $HfO_2$, $ZrO_2$, $Ta_2O_5$, $TiO_2$, $SrTiO_5$ and $(Ba,Sr)TiO_5$. The first gate insulating layer 120 may be formed to an appropriate thickness in accordance with the kind or type of target device to be formed. In a case where the first gate insulating layer 120 comprises $HfO_2$, the first gate insulating layer 120 may be formed to a thickness of, for example, approximately 50 Å or less (specifically in a range of approximately 5 to 50 Å); however aspects of the present inventive concepts are not limited thereto.

Since the semiconductor device 1 shown in FIG. 1 has a gate-first structure, the first gate insulating layer 120 may be planarly formed according to the shape of the substrate 100. In a gate-first structure, the gate electrode is applied to the substrate prior to certain high-temperature fabrication processes.

The first barrier layer 131 may be formed on the first gate insulating layer 120. The first barrier layer 131 may include, for example, TiN, or other suitable material having barrier properties. The first barrier layer 131 prevents a material contained in the first work function control layer 140 (for example, at least one of Al, Ti, and Ta) from penetrating into the first gate insulating layer 120.

The first work function control layer 140 is formed on the first barrier layer 131. The first work function control layer 140 may have the effect to controlling the work function and the threshold voltage (Vt) of the resulting PMOS transistor. For example, the first work function control layer 140 may comprise, but is not limited to, at least one of Al, Ti and Ta, or other suitable material. Any material can be used as the material for forming the first work function control layer 140 so long as it can perform the functions stated above. The first work function control layer 140 may have a thickness of greater than 0 Å and less than about 8 Å. For example, the first work function control layer 140 may have a thickness of about 4 Å.

The second barrier layer 132 is formed on the first work function control layer 140. The second barrier layer 132 may include, for example, TiN, or other suitable barrier material. The second barrier layer 132 prevents a material contained in the second work function control layer 160 from penetrating into the first gate insulating layer 120.

The second work function control layer 160 is formed on the second barrier layer 132. The second work function control layer 160 may control a work function and a threshold voltage (Vt) of an NMOS transistor. For example, the second work function control layer 160 may comprise, but not limited to, La, or other suitable material. Any material can be used as the material for forming the second work function control layer 160 so long as it can perform the functions stated above. The second work function control layer 160 may have a thickness of greater than 0 Å and less than about 8 Å. For example, the second work function control layer 160 may have a thickness of about 4 Å.

When the semiconductor device 1 according to the first embodiment of the present inventive concepts is in the form of a PMOS transistor, formation of the second work function control layer 160 may not be necessary. However, in a fabrication process whereby a PMOS transistor and an NMOS transistor are simultaneously formed, the second work function control layer 160 may remain on the PMOS transistor. In a case where the second work function control layer 160 affects operating characteristics of the semiconductor device 1 to only a minimal degree, the second work function control layer 160 is not removed. However, in cases where the second work function control layer 160 may considerably affect operating characteristics of the semiconductor device 1, the second work function control layer 160 may be removed.

A first source/drain 170 may be a P-type source/drain doped with P-type impurities. The first source/drain 170 may comprise, but is not limited to, a low doped drain (LDD). The type of the first source/drain 170 may vary according to the kind of device to be formed.

Meanwhile, the first barrier layer 131 is formed to have a first thickness W1, and the second barrier layer 132 is formed to have a second thickness W2. In one embodiment, the second thickness W2 is less than the first thickness W1. For example, the first thickness W1 of the first barrier layer 131 may be in a range between about 20 Å and about 40 Å, and the second thickness W2 of the second barrier layer 132 may be greater than 0 Å and less than about 20 Å. In an example embodiment, when the first work function control layer 140 has a thickness of about 4 Å, the first thickness W1 may be about 25 Å, and the second thickness W2 may be about 10 Å.

In the semiconductor device 1 according to the first embodiment of the present inventive concepts, the first barrier layer 131 may be formed to have a sufficiently large thickness, while minimizing a thickness of the first work function control layer 140. In such a manner, the material contained in the first work function control layer 140 (for example, at least one of Al, Ti and Ta) may be prevented from passing through the first barrier layer 131 to then penetrate into the first gate insulating layer 120. If the material contained in the first work function control layer 140, (for example, Al), is present in the first gate insulating layer 120, this may result in increased leakage current. Since the first barrier layer 131 is formed to have a sufficiently large thickness and the first work function control layer 140 has a minimized thickness, the material contained in the first work function control layer 140 is not present in the first gate insulating layer 120. Accordingly, the operating characteristics of the semiconductor device 1 according to the first embodiment of the present inventive concepts are improved.

The thickness of the second barrier layer 132 may be selected according to the material and thickness of the second work function control layer 160. As described herein, in some cases, the second work function control layer 160 may not be formed.

Figure 2:
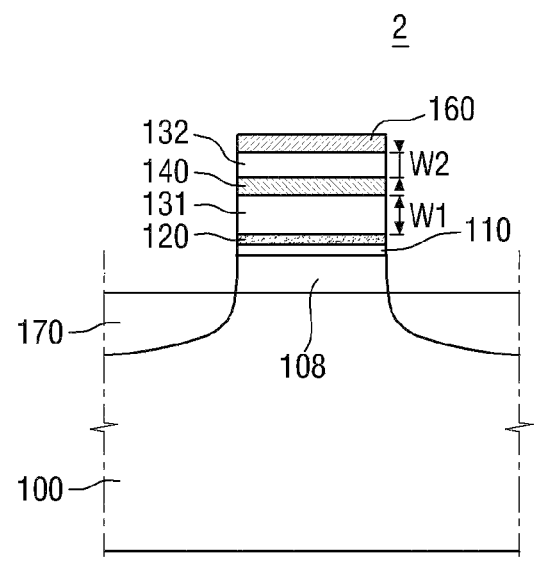
FIG. 2 is cross-sectional view of a semiconductor device according to a second embodiment of the present inventive concepts.

FIG. 2 is cross-sectional view of a semiconductor device according to a second embodiment of the present inventive concepts. For the sake of convenient explanation, the following description will focus on differences between the semiconductor devices shown in FIGS. 1 and 2.

Referring to FIG. 2, in the semiconductor device 2 according to the second embodiment of the present inventive concepts, a stress layer 108 may further be present between the substrate 100 and the first gate insulating layer 120. In a case where the semiconductor device 2 is a PMOS transistor, the stress layer 108 may comprise a compressive stress layer. For example, the compressive stress layer may include SiGe, or other suitable material for inducing compressive stress. The stress layer 108 may be positioned on a channel region (that is, under a gate electrode); however, aspects of the present inventive concepts are not limited thereto.

Figure 3:
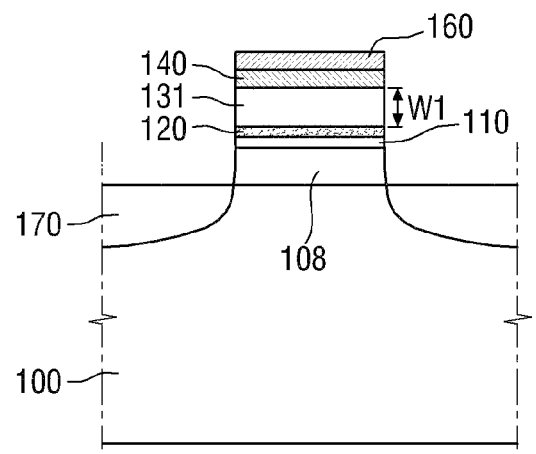
FIG. 3 is cross-sectional view of a semiconductor device according to a third embodiment of the present inventive concepts.

FIG. 3 is cross-sectional view of a semiconductor device according to a third embodiment of the present inventive concepts. For the sake of convenient explanation, the following description will focus on differences between the semiconductor devices shown in FIGS. 1 and 3.

Referring to FIG. 3, in the semiconductor device 3 according to the third embodiment of the present inventive concepts, a second barrier layer 132 is not present. From another perspective, the second barrier layer 132 can be said to have a second thickness of 0 Å. Therefore, in this configuration, the first work function control layer 140 and the second work function control layer 160 may be formed to contact each other. Since a first thickness W1 of the first barrier layer 131 is sufficiently large, materials forming the first work function control layer 140 and the second work function control layer 160 are prevented from passing through the first barrier layer 131 to then penetrate into the first gate insulating layer 120. Therefore, the materials forming the first work function control layer 140 and the second work function control layer 160 are not present in the first gate insulating layer 120.

Figure 4:
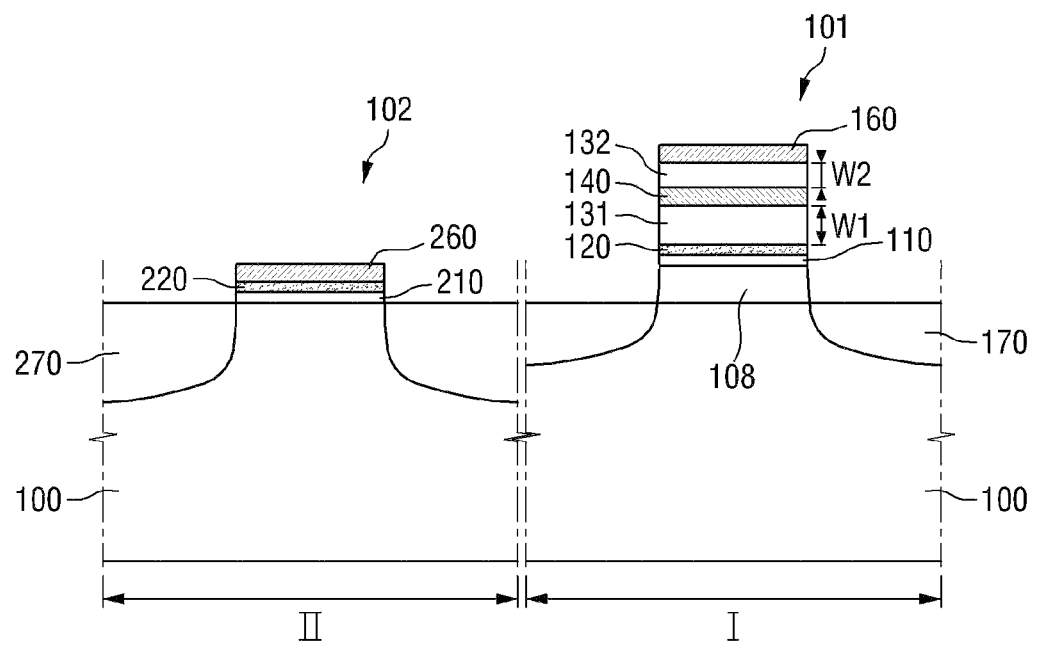
FIG. 4 is cross-sectional view of a semiconductor device according to a fourth embodiment of the present inventive concepts.

FIG. 4 is cross-sectional view of a semiconductor device according to a fourth embodiment of the present inventive concepts. For the sake of convenient explanation, the following description will focus on differences between the semiconductor devices shown in FIGS. 2 and 4.

Referring to FIG. 4, a first region I and a second region II are defined in a substrate 100. A PMOS transistor 101 is formed on the first region I, and an NMOS transistor 102 is formed on the second region II.

The PMOS transistor 101 formed on the first region I may include a stress layer 108, a first interface layer 110, a first gate insulating layer 120, a first barrier layer 131, a first work function control layer 140, a second barrier layer 132, and a second work function control layer 160.

The NMOS transistor 102 formed on the second region II may include a second interface layer 210, a second gate insulating layer 220, a third work function control layer 260, and a second source/drain 270.

The second interface layer 210 may be formed to have substantially the same thickness as the first interface layer 110. The second interface layer 210 may include, for example, silicon oxide, silicon oxynitride, and silicate.

The second gate insulating layer 220 is formed on the second interface layer 210 and may include a high-k dielectric material. In some embodiments, the material of the second gate insulating layer is selected from the group consisting of $HfO_2$, $ZrO_2$, $Ta_2O_5$, $TiO_2$, $SrTiO_3$ and $(Ba,Sr)TiO_3$.

The third work function control layer 260 is positioned on the second gate insulating layer 220 and may have substantially the same thickness as the second work function control layer 160. The third work function control layer 260 may control a work function and a threshold voltage (Vt) of an NMOS transistor. For example, the material third work function control layer 260 may include La, or another suitable material or combination of materials. Any material can be used as the material for forming the third work function control layer 260 so long as it can perform the desired functions stated herein. The third work function control layer 260 may have a thickness of greater than 0 Å and less than about 8 Å. For example, the third work function control layer 260 may have a thickness of about 4 Å.

In this example embodiment, the NMOS transistor 102 does not include a work function control layer, such as Al, Ti, or Ta.

Figure 5:
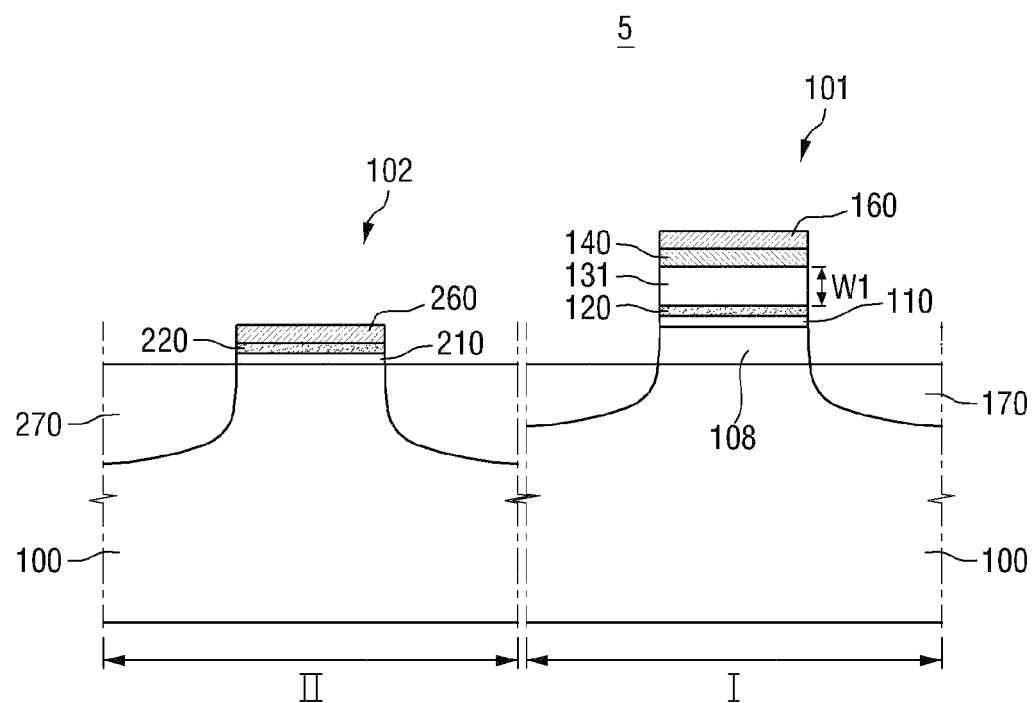
FIG. 5 is cross-sectional view of a semiconductor device according to a fifth embodiment of the present inventive concepts.

FIG. 5 is cross-sectional view of a semiconductor device according to a fifth embodiment of the present inventive concepts. For the sake of convenient explanation, the following description will focus on differences between the semiconductor devices shown in FIGS. 4 and 5.

Referring to FIG. 5, in the semiconductor device 5 according to the fifth embodiment of the present inventive concepts, a second barrier layer 132 is not present on a first region I of the substrate 100. From another perspective, the second barrier layer 132 can be considered to have a second thickness of 0 Å. Therefore, in this embodiment, the first work function control layer 140 and the second work function control layer 160 may be configured to contact each other. Since a first thickness W1 of the first barrier layer 131 is sufficiently large, materials forming the first work function control layer 140 and the second work function control layer 160 are prevented from passing through the first barrier layer 131 to then penetrate into the first gate insulating layer 120.

Hereinafter, a fabricating method of the semiconductor device according to the fourth embodiment of the present inventive concepts will be described with reference to FIGS. 4 and 6 to 9.

FIGS. 6 to 9 illustrate intermediate process steps for explaining a fabricating method of the semiconductor device according to the fourth embodiment of the present inventive concepts.

Figure 6:
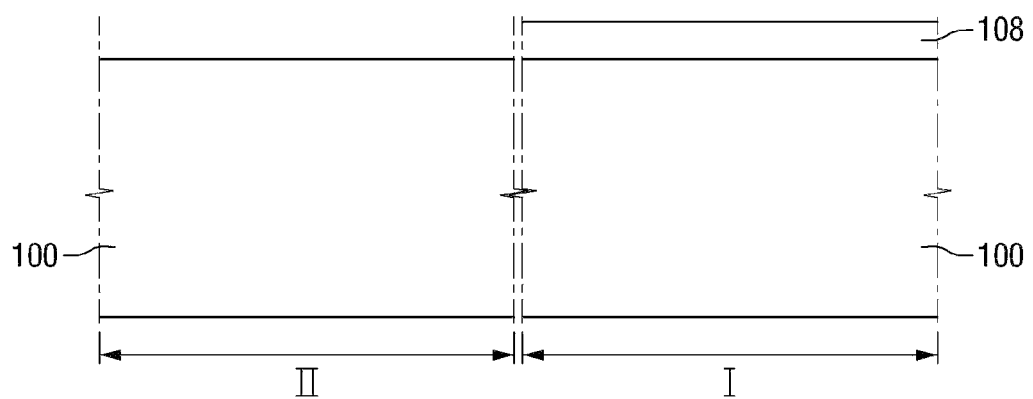
FIGS. 6 to 9 illustrate intermediate process steps for explaining a fabricating method of the semiconductor device according to the a fourth embodiment of the present inventive concepts.

Referring first to FIG. 6, a substrate 100 having a first region I and a second region II defined therein is provided.

Next, a stress layer 108 is formed on the second region II. In some embodiments, the stress layer 108 may be formed by epitaxial growth, for example.

Figure 7:
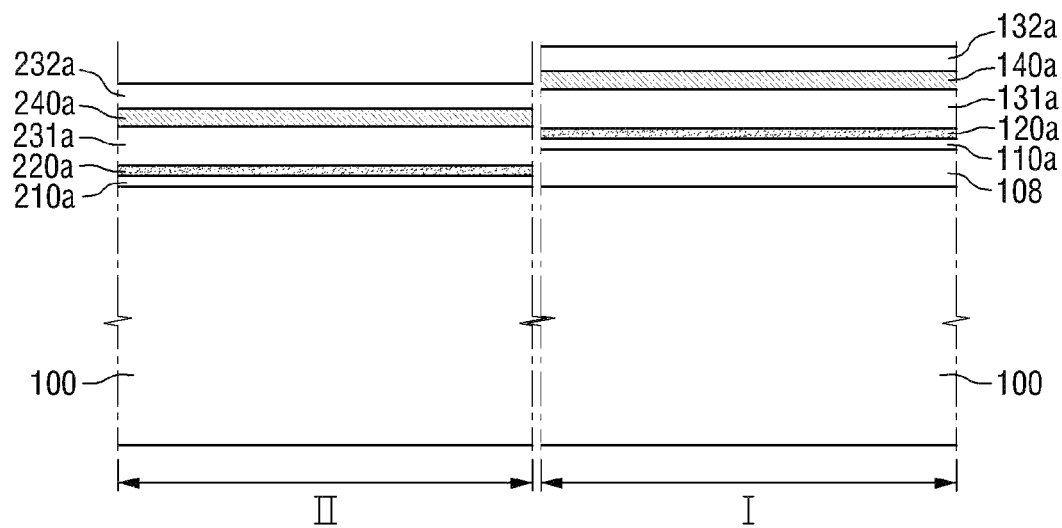

Referring to FIG. 7, material layers 110a and 210a for forming a first interface layer (110 of FIG. 4) and a second interface layer (210 of FIG. 4) are formed on the substrate 100. As described above, the material layers 110a and 210a may include silicon oxide, silicon oxynitride, and silicate.

For example, the substrate 100 may be washed with ozone gas or ozone water, thereby forming the material layers 110a and 210a.

Next, first insulating layers 120a and 220a for forming a first gate insulating layer (120 of FIG. 4) and a second gate insulating layer (220 of FIG. 4) are formed on the material layers 110a and 210a. As described above, in some embodiments, the first insulating layers 120a and 220a may include a material selected from the group consisting of $HfO_2$, $ZrO_2$, $Ta_2O_5$, $TiO_2$, $SrTiO_3$ and $(Ba,Sr)TiO_3$. The first insulating layers 120a and 220a may be formed by, for example, atomic layer deposition (ALD), chemical vapor deposition (CVD), or physical vapor deposition (PVD).

Next, first conductive layers 131a and 213a for forming a first barrier layer (131 of FIG. 4) are formed on the first insulating layers 120a and 220a. In some embodiments, the first conductive layers 131a and 213a may include, for example, TiN, and may be formed by ALD, CVD, or PVD.

Next, second conductive layers 140a and 240a for forming a first work function control layer (140 of FIG. 4) are formed on the first conductive layers 131a and 213a. In some embodiments, the second conductive layers 140a and 240a may include, for example, at least one of Al, Ti and Ta, and may be formed by ALD, CVD, or PVD.

Next, third conductive layers 132a and 232a for forming a second barrier layer (132 of FIG. 4) are formed on the second conductive layers 140a and 240a. In some embodiments, the third conductive layers 132a and 232a may include, for example, TiN, and may be formed by ALD, CVD, or PVD.

Figure 8:
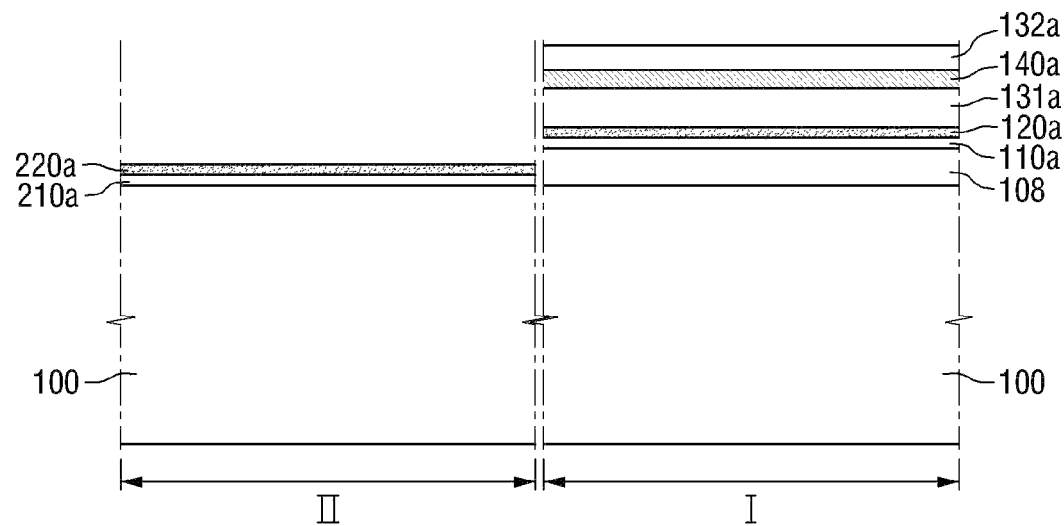

Referring to FIG. 8, the third conductive layer 232a, the second conductive layer 240a and the first conductive layer 231a, formed on the second region II, are removed. For example, the third conductive layer 232a, the second conductive layer 240a and the first conductive layer 231a may be removed by, for example, dry etching or wet etching.

Figure 9:
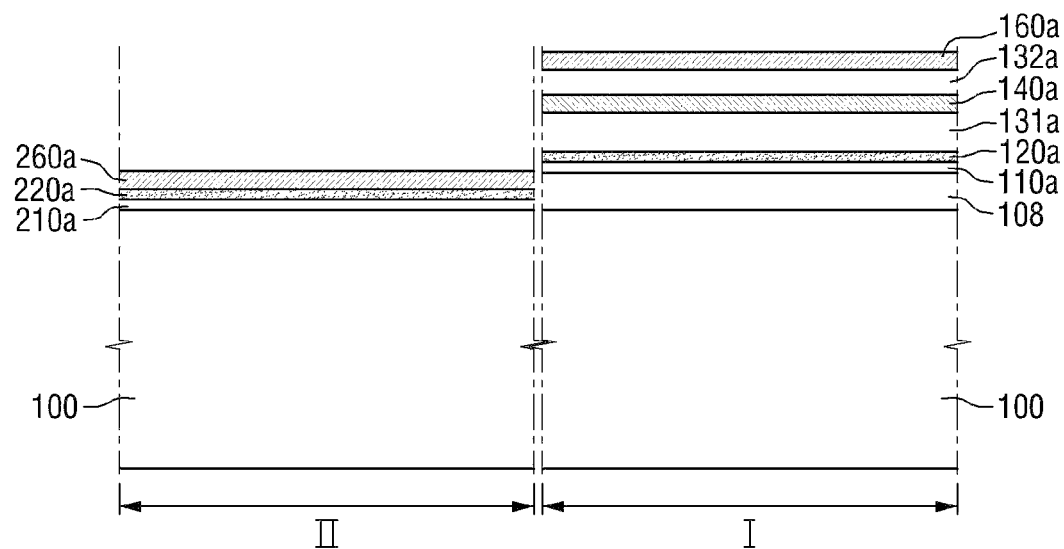

Referring to FIG. 9, fourth conductive layers 160a and 260a for forming a second work function control layer 160 and a third work function control layer 260 are formed on the third conductive layer 132a of the first region I and on the second gate insulating layer 220a of the second region II.

Referring again to FIG. 4, the fourth conductive layers 160a and 260a, the third conductive layer 132a, the second conductive layer 140a, and the first conductive layer 131a are patterned, thereby sequentially forming the second work function control layer 160, the third work function control layer 260, the second barrier layer 132, the first work function control layer 140, and the first barrier layer 131.

Next, impurities are implanted into the substrate 100, thereby forming a first source/drain 170 and a second source/drain 270.

Figure 10:
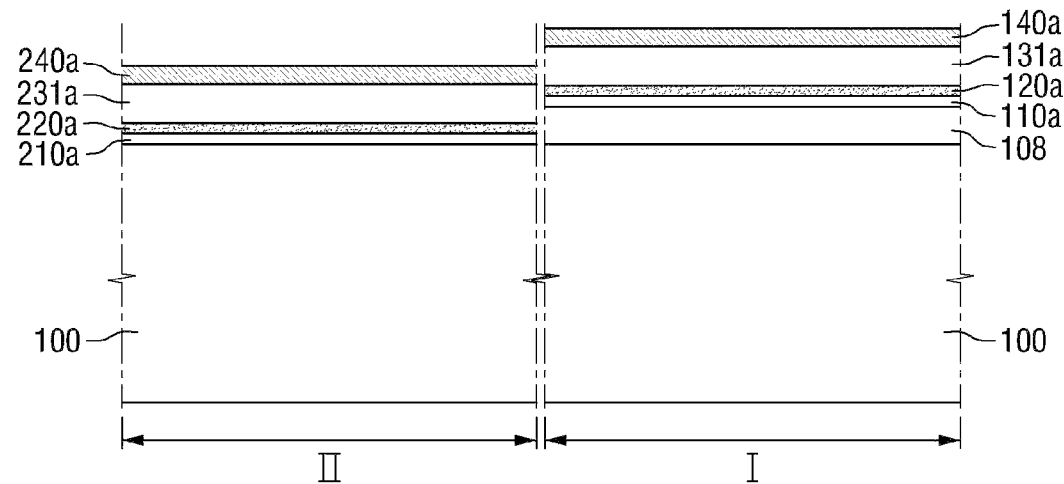
FIGS. 10 to 12 illustrate intermediate process steps for explaining a fabricating method of the semiconductor device according to the fifth embodiment of the present inventive concepts.
Figure 11:
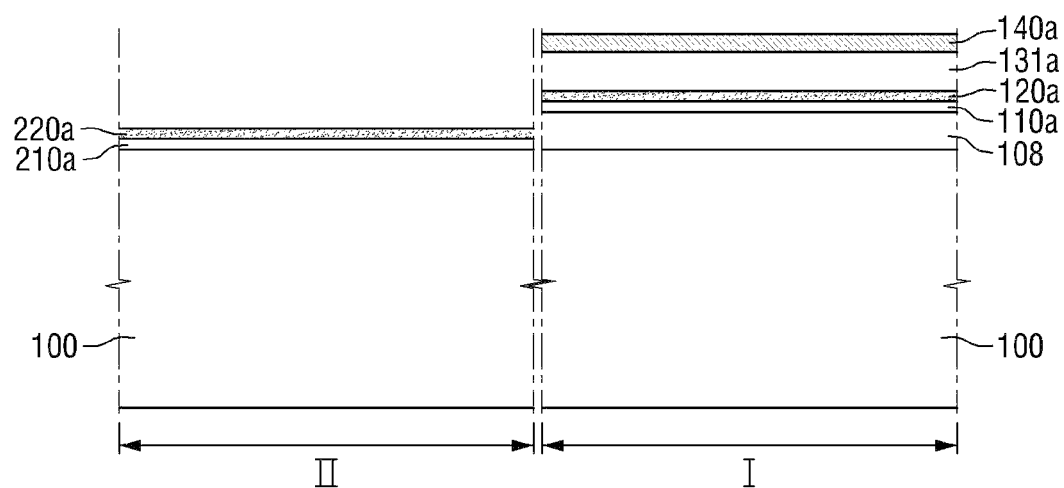
Figure 12:
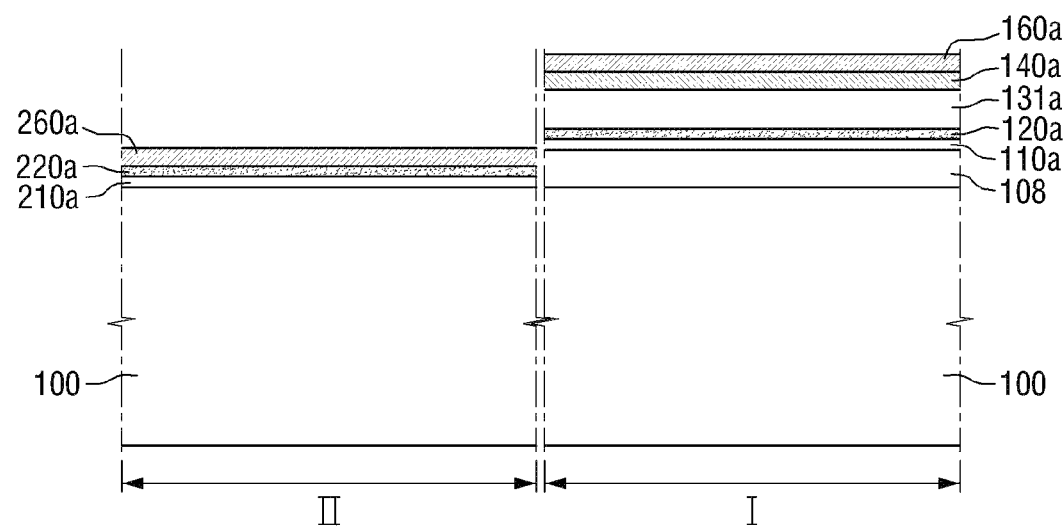

Hereinafter, a fabricating method of the semiconductor device according to the fifth embodiment of the present inventive concepts will be described with reference to FIGS. 5 and 10 to 12. FIGS. 10 to 12 illustrate intermediate process steps for explaining a fabricating method of the semiconductor device according to the fifth embodiment of the present inventive concepts. For the sake of convenient explanation, the following description will focus on differences between the fabricating methods according to the present and previous embodiments.

Referring to FIG. 10, a first region I and a second region II are defined in a substrate 100.

Next, a stress layer 108 is formed on the second region II.

Then, material layers 110a and 210a for forming a first interface layer (110 of FIG. 5) and a second interface layer (210 of FIG. 5) are formed on the substrate 100.

Next, first insulating layers 120a and 220a for forming a first gate insulating layer (120 of FIG. 5) and a second gate insulating layer (220 of FIG. 5) are formed on the material layers 110a and 210a.

Next, first conductive layers 131a and 213a for forming a first barrier layer (131 of FIG. 5) are formed on the first insulating layers 120a and 220a.

Next, second conductive layers 140a and 240a for forming a first work function control layer (140 of FIG. 5) are formed on the first conductive layers 131a and 213a.

Referring to FIG. 11, the second conductive layer 240a and the first conductive layer 231a, formed on the second region II, are removed.

Referring to FIG. 12, fourth conductive layers 160a and 260a for forming a second work function control layer (160 of FIG. 5) and a third work function control layer (260 of FIG. 5) are formed on the second conductive layer 140a of the first region I and on the second gate insulating layer 220a of the second region II.

Referring again to FIG. 5, the fourth conductive layers 160a and 260a, the second conductive layer 140a, and the first conductive layer 131a are patterned, thereby sequentially forming the second work function control layer 160, the third work function control layer 260, the first work function control layer 140, and the first barrier layer 131.

Next, impurities are implanted into the substrate 100, thereby forming a first source/drain 170 and a second source/drain 270.

While the present inventive concepts has been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A semiconductor device comprising:
a first gate insulating layer on a substrate;
a first barrier layer on the first gate insulating layer, the first barrier layer having a first thickness;
a first work function control layer on the first barrier layer; and
a second barrier layer on the first work function control layer such that the first work function control layer is between the first barrier layer and the second barrier layer, the second barrier layer having a second thickness, the second thickness being less than the first thickness, and
a second work function control layer on the second barrier layer, the second work function control layer comprising a material that is different than a material of the first work function control layer.

2. The semiconductor device of claim 1, wherein the first work function control layer includes at least one of Al, Ti and Ta, and the second work function control layer includes La.

3. The semiconductor device of claim 1, wherein a metallic material included in the first work function control layer is not present in the first gate insulating layer.

4. The semiconductor device of claim 1, wherein the first barrier layer has a first thickness in a range between about 20 Å and about 40 Å.

5. The semiconductor device of claim 4, wherein the second barrier layer has a second thickness in a range of greater than 0 Å and less than about 20 Å.

6. The semiconductor device of claim 1, further comprising a stress layer between the substrate and the first gate insulating layer.

7. A semiconductor device comprising:
a substrate having first region and a second region defined therein;
a PMOS transistor including a first gate insulating layer, a first barrier layer having a first thickness, a P-type work function control layer and a second barrier layer having a second thickness less than the first thickness, which are sequentially formed on the first region; and
an NMOS transistor including a second gate insulating layer and an N-type work function control layer, which are sequentially formed on the second region,
wherein the PMOS transistor further includes an N-type work function control layer on the second barrier layer and the N-type work function control layer comprises a material that is different than a material of the P-type work function control layer.

8. The semiconductor device of claim 7, wherein the P-type work function control layer includes at least one of Al, Ti and Ta, and the N-type work function control layer includes La.

9. The semiconductor device of claim 7, wherein a metallic material contained in the P-type work function control layer is not present in the first gate insulating layer.

10. The semiconductor device of claim 7, wherein the first barrier layer has a first thickness in a range between about 20 Å and about 40 Å, and the second barrier layer has a second thickness in a range of greater than 0 Å and less than about 20 Å.

11. The semiconductor device of claim 7, further comprising a stress layer between the first region of the substrate and the first gate insulating layer.

12. A semiconductor device comprising:

a PMOS transistor in a first region of a substrate, the PMOS transistor comprising a PMOS gate structure and source/drain regions in the substrate at sides of the PMOS gate structure, the PMOS gate structure comprising a first gate insulating layer, a first barrier layer on the first gate insulating layer, a first work function control layer on the first barrier layer and a second work function control layer on the first work function control layer such that the first work function control layer is between the first barrier layer and the second barrier layer; and an NMOS transistor in a second region of a substrate, the NMOS transistor comprising an NMOS gate structure and source/drain regions in the substrate at sides of the NMOS gate structure, and wherein the PMOS gate structure further comprises a second barrier layer on the first work function control layer of the PMOS gate structure and wherein the second work function control layer of the PMOS gate structure is on the second barrier layer of the PMOS gate structure, wherein the second barrier layer is of a thickness that is less than a thickness of the first barrier layer.

13. The semiconductor device of claim 12 wherein the first gate insulating layer comprises a high-k material.

14. The semiconductor device of claim 12 wherein the second work function control layer of the PMOS gate structure is in direct contact with the first work function control layer of the PMOS gate structure.

15. The semiconductor device of claim 12 wherein the NMOS gate structure comprises a first gate insulating layer, a first barrier layer on the first gate insulating layer and a first work function control layer on the first gate insulating layer.

* * * * *